US012586618B2

(12) United States Patent
Yang

(10) Patent No.: US 12,586,618 B2
(45) Date of Patent: Mar. 24, 2026

(54) MEMORY SYSTEM AND MEMORY DIE

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 192 days.

(21) Appl. No.: 18/429,466

(22) Filed: Feb. 1, 2024

(65) Prior Publication Data

US 2025/0252983 A1     Aug. 7, 2025

(51) Int. Cl.
G11C 7/10        (2006.01)
G11C 7/14        (2006.01)
H03K 19/20       (2006.01)

(52) U.S. Cl.
CPC .............. G11C 7/1096 (2013.01); G11C 7/14 (2013.01); H03K 19/20 (2013.01)

(58) Field of Classification Search
CPC ......... G11C 7/1096; G11C 7/14; H03K 19/20

USPC ........................................................ 365/191
See application file for complete search history.

(56) References Cited

U.S. PATENT DOCUMENTS

2016/0078906 A1     3/2016  Yamaguchi et al.
2021/0105161 A1*    4/2021  Hasbun ................... G11C 7/10

OTHER PUBLICATIONS

"Office Action of Taiwan Counterpart Application", issued on Nov. 22, 2024, p. 1-p. 5.

* cited by examiner

*Primary Examiner* — Huan Hoang
(74) *Attorney, Agent, or Firm* — JCIPRNET

(57) ABSTRACT

Memory systems and memory dies are provided. The memory system of the present disclosure comprises a plurality of memory dies. The plurality of memory dies are stacked within the memory system. The plurality of memory dies respectively comprises a plurality of numbering circuits. The plurality of numbering circuits are coupled in series as a string. A current stage numbering circuit in the string comprises a plurality of sub-circuits. The plurality of sub-circuits are configured to respectively generate bits of a current stage number signal directly using bits of a previous stage number signal from a previous stage numbering circuit.

20 Claims, 5 Drawing Sheets

T2b

| Input | | Output | |
|---|---|---|---|
| PNS[1] | PNS[0] | CNS[1] | CNS[0] |
| 0 | 0 | 0 | 1 |
| 0 | 1 | 1 | 0 |
| 1 | 0 | 1 | 1 |
| 1 | 1 | 0 | 0 |

| Input | | | Output | | |
|---|---|---|---|---|---|
| PNS[2] | PNS[1] | PNS[0] | CNS[2] | CNS[1] | CNS[0] |
| 0 | 0 | 0 | 0 | 0 | 1 |
| 0 | 0 | 1 | 0 | 1 | 0 |
| 0 | 1 | 0 | 0 | 1 | 1 |
| 0 | 1 | 1 | 1 | 0 | 0 |
| 1 | 0 | 0 | 1 | 0 | 1 |
| 1 | 0 | 1 | 1 | 1 | 0 |
| 1 | 1 | 0 | 1 | 1 | 1 |
| 1 | 1 | 1 | 0 | 0 | 0 |

FIG. 3A

MEMORY SYSTEM AND MEMORY DIE

BACKGROUND

1. Technical Field

The disclosure generally relates to a system and a die, and more particularly, to a memory system and a memory die.

2. Description of Related Art

The three-dimensional integrated circuit (3DIC) have grown rapidly. In order to correctly access all dies stacked in the 3DIC, an identification number corresponding to a level where the die is in the stack may be programmed or set to each die through hardwires or e-fuses. However, these methodologies are required to be applied to each of the memory die they are stacked, or even during fabrication. In this way, a possibility that an error to occur in the 3DIC gets higher since each die is labeled with the identification number and must be placed on a corresponding level in the stack.

SUMMARY

Accordingly, the present disclosure is directed to a memory system and a memory die capable of automatically and internally generating a number signal corresponding to the level where the memory die is in the 3DIC stack.

The memory system of the present disclosure comprises a plurality of memory dies. The plurality of memory dies are stacked within the memory system. The plurality of memory dies respectively comprises a plurality of numbering circuits. The plurality of numbering circuits are coupled in series as a string. A current stage numbering circuit in the string comprises a plurality of sub-circuits. The plurality of sub-circuits are configured to respectively generate bits of a current stage number signal directly using bits of a previous stage number signal from a previous stage numbering circuit.

The memory die of the present disclosure is adapted to be stacked within a memory system. The memory die comprises a numbering circuit configured to generate a current stage number signal according to a previous stage number signal. The numbering circuit comprises a plurality of sub-circuits configured to respectively generate bits of the current stage number signal directly using bits of the previous stage number signal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A illustrates a truth table of a numbering circuit according to some embodiments of the present disclosure.

FIG. 3A illustrates a truth table of a numbering circuit according to some embodiments of the present disclosure.

DESCRIPTION OF THE EMBODIMENTS

Figure 1:
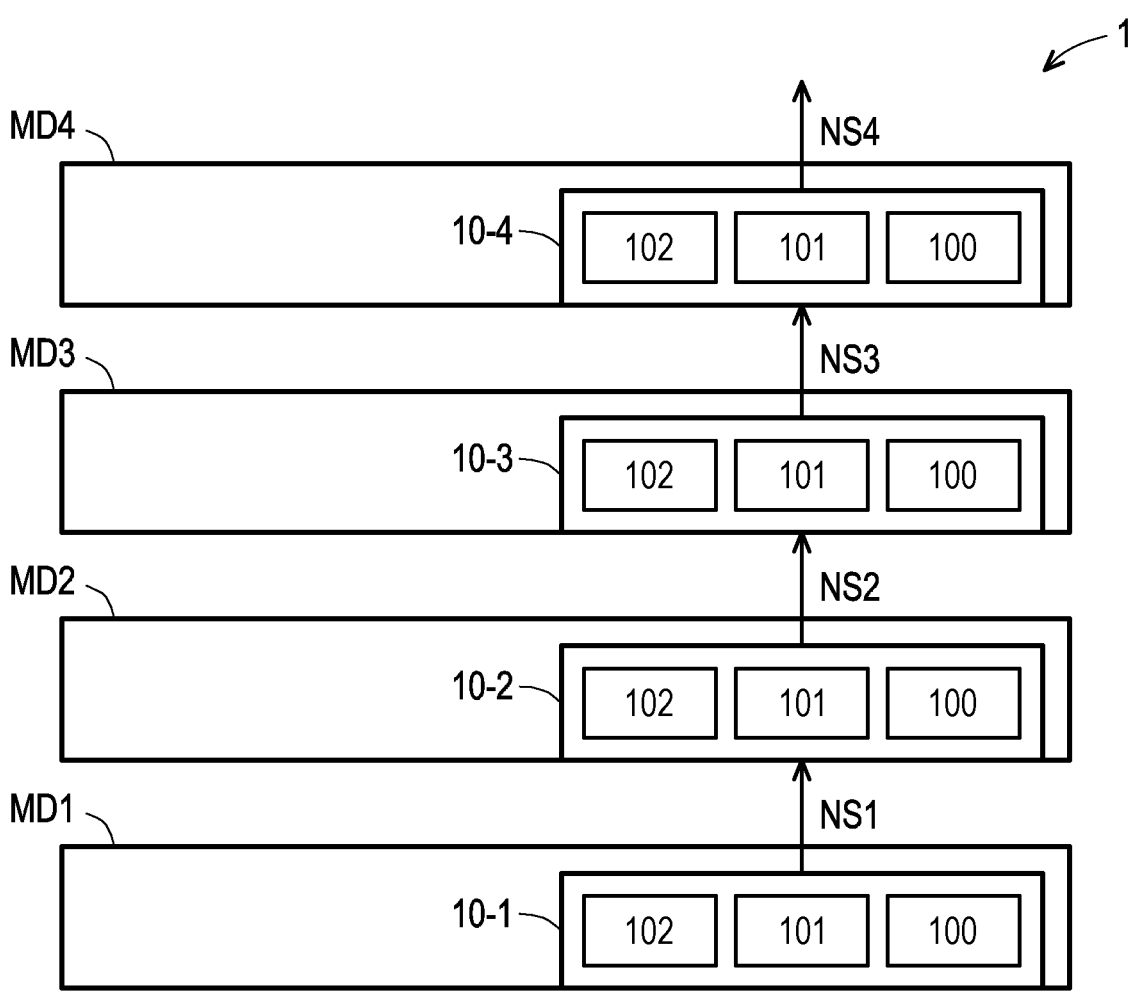
FIG. 1 illustrates a memory system according to some embodiments of the present disclosure.

FIG. 1 illustrates a memory system 1 according to some embodiments of the present disclosure. The memory system 1 includes a plurality of memory dies MD1-MD4 stacked along a vertical direction within the memory system 1 serving as a three-dimensional integrated circuit (3DIC) system. Each memory die in the stack is coupled to adjacent memory die on top or bottom level using through silicon vias (TSVs) for supports and data exchange. Each memory die includes a numbering circuit configured to generate a current stage number signal corresponding to a level where the memory die is in the stack, automatically providing a location information for each memory die. For example, when the memory die receives a read/write signal carrying an address information from a logic die intending to access one of the memory die, the memory die may utilize the current stage number signal to determine whether or not to execute the received read/write signal. In some embodiments, the plurality of memory dies MD1-MD4 have the same structure, respectively utilizing the numbering circuit inside to generate the corresponding current number signal, so that a design complexity of the memory system 1 may be effectively reduced.

Specifically, the plurality of numbering circuits 10-1 to 10-4 respectively disposed in the memory dies MD1-MD4 are coupled in series as a string. Each numbering circuit may be functioning as a current stage numbering circuit configured to generate the current stage number signal according to a previous stage number signal received from a previous numbering circuit in the string. Taking the numbering circuit 10-2 in the memory die MD2 as an example, the numbering circuit 10-2 is configured to receive a previous stage number signal NS1 from the numbering circuit NS1 of the previous stage, and generate a current stage number signal NS2 accordingly. Further, each numbering circuit includes a plurality of sub-circuits. Each sub-circuit is configured to generate a corresponding bit of the current stage number signal directly using at least one bit of the previous stage number signal as inputs. In some aspects, by directly using bits of the previous stage number signal as inputs may achieve advantages such as but not limited to higher computing speed.

FIG. 2A illustrates a truth table T2*b* of a numbering circuit according to some embodiments of the present disclosure. Although it is depicted in FIG. 1 that each numbering circuit includes three sub-circuits, however the number of the sub-circuits in each numbering circuit may be altered based on a required bit number of the processed number signal. In such embodiment in FIG. 2A, the truth table T2*b* records a relationship between bits of an input previous stage number signal PNS and bits of an output current stage number signal CNS processed by a three-bit numbering circuit. That is, the numbering circuit in such embodiment is configured to receive the three-bit previous stage number signal PNS and generate the three-bit current stage number signal CNS.

In such embodiment, the numbering circuit may be configured to generate the current stage number signal by adding a value of the received previous stage number signal by one. In this way, each numbering circuit in the string may be configured to generate the number signal in an increasing order. In other embodiments, the numbering circuit may be configured to generate the current stage number signal according to the previous stage number signal following other orders or rules. For example, the numbering circuit may be configured to generate the current stage numbering signal in a descending order or in an increasing manner with an offset by two.

The bits of the current stage number signal CNS may be simplified and represented by the following equations.

$$CNS[0] = \overline{PNS[0]}$$

$$CNS[1] = PNS[1] \oplus PNS[0]$$

According to the above equations derived from the truth table T2$b$, the LSB CNS[0] of the current stage number signal CNS may obtained through inverting the LSB PNS[0] of the previous stage number signal PNS. The second LSB CSN[1] of the current stage number signal CNS may be obtained through performing XOR operation on the second LSB PNS[1] and the LSB PNS[0] of the previous stage number signal PNS.

Figure 2B:
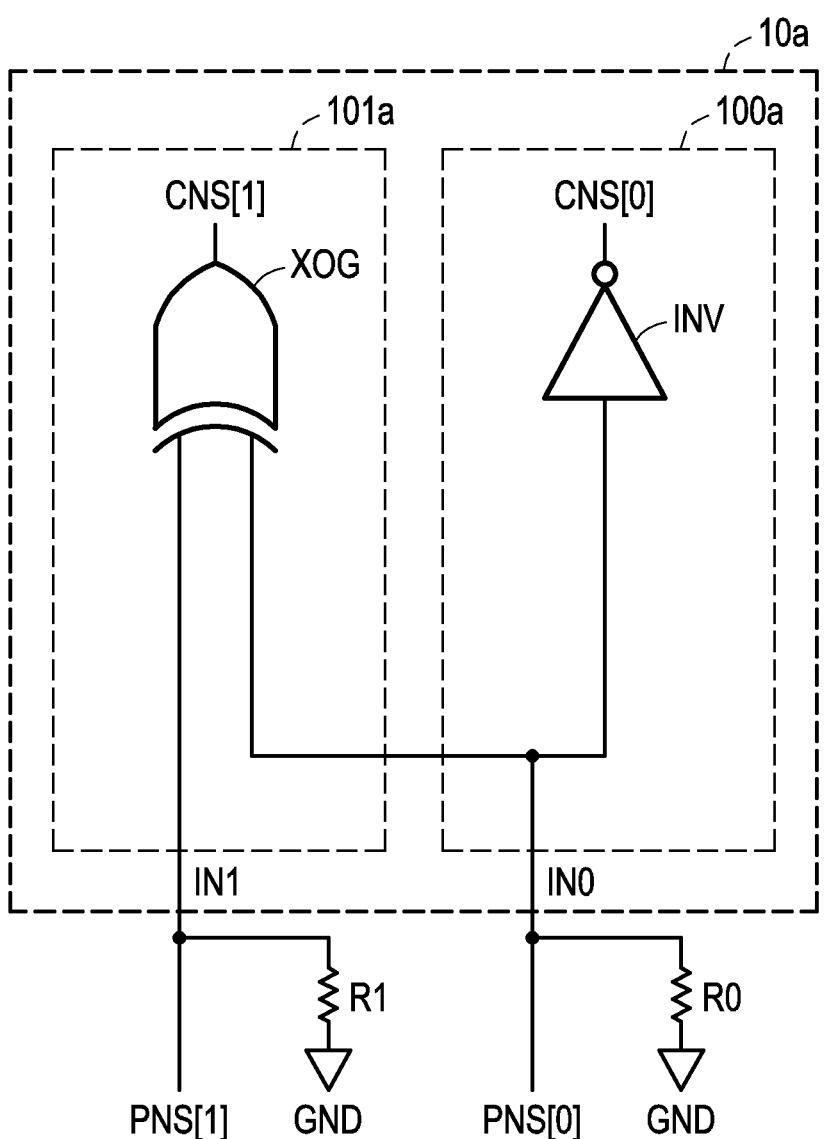
FIG. 2B illustrates a schematic diagram of a numbering circuit according to some embodiments of the present disclosure.

FIG. 2B illustrates a schematic diagram of a numbering circuit 10$a$ according to some embodiments of the present disclosure. The numbering circuit 10$a$ may be implemented to realize the functions of the truth table T2$b$ in FIG. 2A. Specifically, the numbering circuit 10$a$ includes a first sub-circuit 100$a$ and a second sub-circuit 101$a$. Both of the first sub-circuit 100$a$ and the second sub-circuit 101$a$ directly receive bits of the previous stage number signal PNS as inputs to generate the bits of the current stage number signal CNS, respectively. Particularly, the first sub-circuit 100$a$ includes an inverter INV and is configured to generate a least significant bit (LSB) CNS[0] of the current stage number signal PNS according to an LSB PNS[0] of the previous stage number signal CNS. The second sub-circuit 101$a$ includes an exclusive OR (XOR) gate XOG configured to generate a second LSB CNS[1] of the current stage number signal CNS according to the LSB PNS[0] and a second LSB PNS[1] of the previous stage number signal PNS. By the schematic structure as illustrated in FIG. 2B, the numbering circuit 10$a$ may be capable of realizing the truth table T2$b$ in FIG. 2A.

Moreover, in addition to the previous stage number signal PNS, a reference voltage GND is also provided to input terminals IN0-IN1 of the numbering circuit 10$a$. Specifically, the bits PNS[0], PNS[1] of the previous stage number signal PNS are respectively provided to the input terminals IN0, IN1 of the numbering circuit 10$a$. Further, the reference voltage GND is also provided to the input terminals IN0, IN1 respectively through the resistors R0, R1. The reason why the input terminals of the numbering circuit 10$a$ are all coupled to the reference voltage GND is to provide an initial predetermined number signal to a first stage numbering circuit 10$a$ in the string. Every numbering circuit 10$a$ in the serially coupled string is configured to receive the previous stage number signal PNS from the previous stage except the numbering circuit of the first stage. Therefore, in order to provide an initial value to the first stage numbering circuit 10$a$ in the string, the reference voltage GND is provided to the input terminals IN0, IN1 serving as bit value 0. Accordingly, the first stage numbering circuit 10 may be configured generate the current stage number signal CNS with value 1 according to the predetermined number signal.

In order to ensure that the numbering circuits 10$a$ coupled after the first stage numbering circuit 10$a$ in the string may receive the correct previous number signals, the resistors R0, R1 may be selected to provide a weaker driving force than the first sub-circuit 100$a$ and the second sub-circuit 101$a$, such that the first sub-circuit 100$a$ and the second sub-circuit are capable of dominating voltages on the input terminals IN0, IN1, pulling the input terminals IN0, IN1 up or down based on voltages of the generated LSB PNS[0] and the second LSB PNS[1].

FIG. 3A illustrates a truth table T3$b$ of a numbering circuit according to some embodiments of the present disclosure. In such embodiment in FIG. 3A, the truth table T3$b$ records a relationship between bits of an input previous stage number signal PNS and bits of an output current stage number signal CNS processed by a three-bit numbering circuit. That is, the numbering circuit in such embodiment is configured to receive the three-bit previous stage number signal PNS and generate the three-bit current stage number signal CNS.

In such embodiment, the numbering circuit may be configured to generate the current stage number signal by adding a value of the received previous stage number signal by one. In this way, each numbering circuit in the string may be configured to generate the number signal in an increasing order. In other embodiments, the numbering circuit may be configured to generate the current stage number signal according to the previous stage number signal following other orders or rules. For example, the numbering circuit may be configured to generate the current stage numbering signal in a descending order or in an increasing manner with an offset by two.

The bits of the current stage number signal CNS may be simplified and represented by the following equations.

$$CNS[0] = \overline{PNS[0]}$$

$$CNS[1] = PNS[1] \oplus PNS[0]$$

$$CNS[2] = PNS[2] \cdot \overline{PNS[1]} + PNS[2] \cdot \overline{PNS[0]} + \overline{PNS[2]} \cdot PNS[1] \cdot PNS[2]$$

According to the above equations derived from the truth table T3$b$, the LSB CNS[0] of the current stage number signal CNS may obtained through inverting the LSB PNS[0] of the previous stage number signal PNS. The second LSB CSN[1] of the current stage number signal CNS may be obtained through performing XOR operation on the second LSB PNS[1] and the LSB PNS[0] of the previous stage number signal PNS. The third LSB CSN[2] of the current stage number signal CNS may be obtained through calculating a sum of a product of the third LSB PNS[2] and the inverted second LSB PNS[1], and a product of the second LSB PNS[2] and the inverted LSB PNS[0], and a product of the inverted third LSB PNS[2], the second LSB PNS[1], and the LSB PNS[0] of the previous stage number circuit PNS.

Figure 3B:
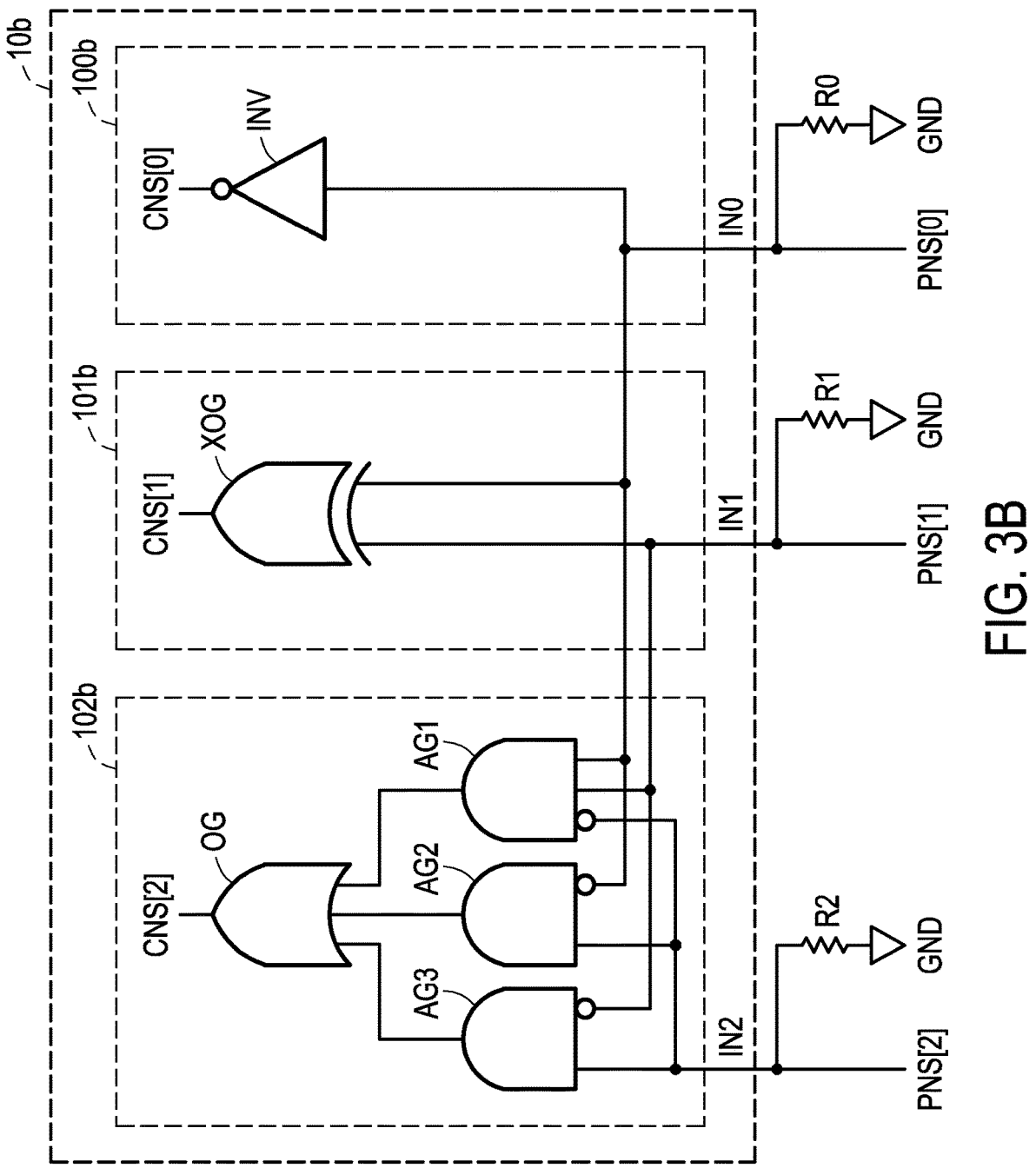
FIG. 3B illustrates a schematic diagram of a numbering circuit according to some embodiments of the present disclosure.

FIG. 3B illustrates a schematic diagram of a numbering circuit 10$b$ according to some embodiments of the present disclosure. Specifically, the numbering circuit 10 is implemented to realize functions of the truth table T3$b$ in FIG. 3A. The numbering circuit 10$b$ includes a first sub-circuit 100$b$, a second sub-circuit 101$b$, and a third sub-circuit 102$b$. As can be seen in the derivations of the LSB CNS[0] and the second LSB CNS[1] above, the last two bits in the three-bit numbering circuit 10$b$ have the same representations as those in the two-bit numbering circuit 10$a$, and thus the first sub-circuit 100$b$ and the second sub-circuit 101$b$ in the numbering circuit 10$b$ for generating the LSB CNS[0] and the second LSB CNS[1] have the same structures as those in the numbering circuit 10a. All of the first to third sub-circuits 100b-102b directly receive bits of the previous stage number signal PNS as inputs to generate the bits of the current stage number signal CNS, respectively. Particularly, the first sub-circuit 100b includes an inverter INV and is configured to generate the LSB CNS[0] of the current stage number signal PNS according to an LSB PNS[0] of the previous stage number signal CNS. The second sub-circuit 101b includes an exclusive OR (XOR) gate XOG configured to generate a second LSB CNS[1] of the current stage number signal CNS according to the LSB PNS[0] and a second LSB PNS[1] of the previous stage number signal PNS.

Further, the third sub-circuit 102b is used to calculating a sum of a product of the third LSB PNS[2] and the inverted second LSB PNS[1], and a product of the second LSB PNS[2] and the inverted LSB PNS[0], and a product of the inverted third LSB PNS[2], the second LSB PNS[1], and the LSB PNS[0] of the previous stage number circuit PNS. The third sub-circuit 102b includes AND gates AG1-AG3 and an OR gate OG. The first AND gate AG1 is configured generate a first logic result according to an LSB PNS[0], a second LSB PNS[1], and an inverted third LSB PNS[2] of the previous stage number signal PNS. The second AND gate AG2 is configured to generate a second logic result according to an inverted LSB PNS[0] and a third LSB PNS[2] of the previous stage number signal PNS. The third AND gate AG3 is configured to generate a third logic result according to an inverted second LSB PNS[1] and the third LSB PNS[2] of the previous stage number signal PNS. The OR gate OG is configured to generate the third LSB CNS[2] of the current stage number signal CNS according to the first to third logic results.

Moreover, in addition to the previous stage number signal PNS, a reference voltage GND is also provided to input terminals IN0-IN2 of the numbering circuit 10b. Specifically, the bits PNS[0], PNS[1], PNS[2] of the previous stage number signal PNS are respectively provided to the input terminals IN0, IN1, IN2 of the numbering circuit 10b. Besides, the reference voltage GND is also provided to the input terminals IN0. IN1, IN2 respectively through the resistors R0, R1, R2.

The reference voltage GND provided through the resistors R0-R2 provides a weaker driving force pulling the voltages at the input terminals IN0-IN2 down. In comparison, the LSB CNS[0], the second LSB CNS[1], and the third LSB CNS[2] generated by the numbering circuit 10b provides a stronger driving force at the input terminals IN0-IN2, thereby dominating the voltages on the input terminals IN0-IN2. The reason for providing the reference voltage GND to the input terminals IN0-IN2 with the weaker driving force is to provide a predetermined number signal to a first stage numbering circuit 10b which is not coupled to a previous stage numbering circuit 10b in the string. The provided reference voltage GND may be read as digital value 0 by the first to third sub-circuits 100b-102b, so that for the first stage numbering circuit 10b may start counting from 0. In order to ensure that the voltages on the input terminals IN0-IN2 are determined by the previous stage number signal PNS rather than the reference voltage GND, the resistors R0-R2 may be properly selected to provide the weaker driving force than the first to third sub-circuits 100b-102b.

In other embodiments, the structures of the first to third sub-circuits 100b-102b in the numbering circuit 10b may be modified based on different design requirements. For example, the third sub-circuit 102 is designed for calculating a sum of products, however the third sub-circuit 102 may be designed for realizing the same function through calculating a product of sums. Moreover, the numbering circuit 10b may also be modified to process the previous stage number signal and the current stage number signal more than three bits based on how a total number of memory dies in each stack.

In summary, each memory die of the memory system is capable of automatically generating a number corresponding to a level where the memory die is in the stack. The memory dies in the memory system may have the same structure without additionally providing any initiating values to the first or any numbering circuits therein. Therefore, the memory system may have an easier design complexity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory system, comprising:
   a plurality of memory dies stacked within the memory system, wherein each of the plurality of memory dies comprising:
   a numbering circuit, the numbering circuits in the memory dies being coupled in series as a string, wherein a current stage numbering circuit in the string comprises:
   a plurality of sub-circuits, each of the sub-circuits configured to generate a bit of a current stage number signal directly using only at least one bit of a previous stage number signal from a previous stage numbering circuit.

2. The memory system of claim 1, wherein each numbering circuit is configured to generate the current stage number signal by adding a value of the previous stage number signal with one.

3. The memory system of claim 1, wherein each numbering circuit is configured to receive a predetermined number signal.

4. The memory system of claim 3, wherein a reference voltage is provided to a plurality of input terminals of each numbering circuit as bits of the predetermined number signal.

5. The memory system of claim 4, wherein a plurality of resistors are respectively coupled between the plurality of input terminals and the reference voltage.

6. The memory system of claim 4, wherein the plurality of bits of the previous stage number signal are respectively provided to the input terminals of the current stage numbering circuit overwriting the predetermined number signal.

7. The memory system of claim 6, wherein a driving force of the previous stage number signal to the input terminals of the current stage numbering circuit is stronger than a driving force of the reference voltage to the input terminals of the current stage numbering circuit.

8. The memory system of claim 1, wherein a first sub-circuit of the current stage numbering circuit comprises:
   an inverter configured to generate an LSB of the current stage number signal according to a least signal significant bit (LSB) of the previous stage number signal.

9. The memory system of claim 1, where a second sub-circuit of the current stage numbering circuit comprises:

an exclusive OR gate configured to generate a second LSB of the current stage number signal according to an LSB and a second LSB of the previous stage number signal.

10. The memory system of claim 1, wherein a third sub-circuit of the current stage numbering circuit comprises:

a first AND gate configured generate a first logic result according to an LSB, a second LSB, and an inverted third LSB of the previous stage number signal;

a second AND gate configured to generate a second logic result according to an inverted LSB and a third LSB of the previous stage number signal;

a third AND gate configured to generate a third logic result according to an inverted second LSB and the third LSB of the previous stage number signal; and an OR gate configured to generate a third LSB of the current stage number signal according to the first to third logic results.

11. A memory die, adapted to be stacked within a memory system, the memory die comprising:

a numbering circuit configured to generate a current stage number signal according to a previous stage number signal, the numbering circuit comprising:

a plurality of sub-circuits, each of the sub-circuits configured to generate a bit of the current stage number signal directly using only at least one bit of the previous stage number signal.

12. The memory die of claim 11, wherein the numbering circuit is configured to generate the current stage number signal by adding a value of the previous stage number signal with one.

13. The memory die of claim 11, wherein the numbering circuit is configured to receive a predetermined number signal.

14. The memory die of claim 13, wherein a reference voltage is provided to a plurality of input terminals of the numbering circuit as bits of the predetermined number signal.

15. The memory die of claim 14, wherein a plurality of resistors are respectively coupled between the plurality of input terminals and the reference voltage.

16. The memory die of claim 14, wherein the plurality of bits of the previous stage number signal are respectively provided to the input terminals of the numbering circuit overwriting the predetermined number signal.

17. The memory die of claim 16, wherein a driving force of the previous stage number signal to the input terminals of the numbering circuit is stronger than a driving force of the reference voltage to the input terminals of the numbering circuit.

18. The memory die of claim 11, wherein a first sub-circuit of the numbering circuit comprises:

an inverter configured to generate an LSB of the current stage number signal according to a least signal significant bit (LSB) of the previous stage number signal.

19. The memory die of claim 11, where a second sub-circuit of the numbering circuit comprises:

an exclusive OR gate configured to generate a second LSB of the current stage number signal according to an LSB and a second LSB of the previous stage number signal.

20. The memory die of claim 11, wherein a third sub-circuit of the numbering circuit comprises:

a first AND gate configured generate a first logic result according to an LSB, a second LSB, and an inverted third LSB of the previous stage number signal;

a second AND gate configured to generate a second logic result according to an inverted LSB and a third LSB of the previous stage number signal;

a third AND gate configured to generate a third logic result according to an inverted second LSB and the third LSB of the previous stage number signal; and an OR gate configured to generate a third LSB of the current stage number signal according to the first to third logic results.

* * * * *